(12) United States Patent
Egitto et al.

(10) Patent No.: US 7,309,529 B2
(45) Date of Patent: Dec. 18, 2007

(54) STRUCTURE AND METHOD FOR IMPROVED ADHESION BETWEEN TWO POLYMER FILMS

(75) Inventors: Frank D. Egitto, Binghamton, NY (US); Luis J. Matienzo, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/985,455

(22) Filed: Nov. 10, 2004

(65) Prior Publication Data

US 2005/0064199 A1 Mar. 24, 2005

Related U.S. Application Data

(62) Division of application No. 10/685,261, filed on Oct. 14, 2003, now Pat. No. 7,067,193, which is a division of application No. 09/878,474, filed on Jun. 11, 2001, now Pat. No. 6,656,313.

(51) Int. Cl.
  *B32B 27/32* (2006.01)
  *B32B 27/38* (2006.01)
  *B32B 27/40* (2006.01)
  *B32B 9/04* (2006.01)

(52) U.S. Cl. .......... 428/525.5; 428/448; 428/451; 428/412; 428/413; 428/423.1; 428/473.5; 428/500

(58) Field of Classification Search .......... 156/272.6, 156/327, 329, 330, 330.9, 331.6; 427/387, 427/579; 428/446, 447, 448, 473.5, 412, 428/413, 423.1, 425.5, 451, 500
See application file for complete search history.

(56) References Cited

U.S. PATENT DOCUMENTS

| | | | | |
|---|---|---|---|---|
| 4,428,796 A | * | 1/1984 | Milgram | 438/746 |
| 4,528,216 A | | 7/1985 | Ogura et al. | |
| 4,732,858 A | * | 3/1988 | Brewer et al. | 438/780 |
| 4,940,651 A | * | 7/1990 | Brown et al. | 430/325 |
| 5,262,505 A | * | 11/1993 | Nakashima et al. | 528/26 |
| 5,473,118 A | * | 12/1995 | Fukutake et al. | 174/258 |
| 5,635,246 A | | 6/1997 | Ogawa et al. | |
| 5,707,701 A | | 1/1998 | Saitoh et al. | |
| 5,851,726 A | | 12/1998 | Ikuta et al. | |
| 5,913,999 A | | 6/1999 | Hayashida et al. | |
| 5,948,484 A | | 9/1999 | Gudimenko et al. | |
| 5,972,739 A | | 10/1999 | Funada et al. | |
| 5,981,056 A | | 11/1999 | Ogawa et al. | |
| 6,191,183 B1 | | 2/2001 | Kobayashi et al. | |
| 6,232,386 B1 | * | 5/2001 | Vargo et al. | 524/434 |
| 6,528,145 B1 | * | 3/2003 | Berger et al. | 428/156 |

* cited by examiner

*Primary Examiner*—Thao Tran
(74) *Attorney, Agent, or Firm*—RatnerPrestia

(57) ABSTRACT

A method for improving the adhesion between polyimide layers and the structure formed by the method. A silicon oxide-containing layer is formed on the surface of a polyimide layer and a second layer of polyimide is formed on the silicon oxide-containing layer.

14 Claims, 9 Drawing Sheets

STRUCTURE AND METHOD FOR IMPROVED ADHESION BETWEEN TWO POLYMER FILMS

This application is a divisional application of U.S. patent application Ser. No. 10/685,261, filed Oct. 14, 2003 now U.S. Pat. No. 7,067,193, incorporated herein by reference, which is a divisional application of U.S. patent application Ser. No. 09/878,474, filed Jun. 11, 2001 now U.S. Pat. No. 6,656,313, issued Dec. 2, 2003.

TECHNICAL FIELD

The present invention relates generally to a method for improving the adhesion between two polymer layers or films. In particular, this invention relates to a method in which a silicon oxide-containing layer is formed on the surface of a polyimide layer, and a second layer of polymeric material is formed on the silicon oxide-containing layer.

BACKGROUND OF THE INVENTION

Polyimides have physical properties that make them especially suited for microelectronic applications. These properties include high thermal stability, low dielectric constant, excellent adhesion to substrates, high radiation stability, excellent planarization, and high flexibility relative to inorganic dielectrics. Thus, polyimide layers are widely used in the electronics industry to provide protection, electrical insulation, or both. They are used, for example, as protective coatings for semiconductors, as dielectric layers for multi-layer integrated circuits, as high-temperature solder masks, as bonding for multilayer circuits, and as the final passivation coating on electronic devices.

Polyimide layers may be formed by vapor deposition techniques in which a precursor is deposited on the substrate and then thermally cured. Vapor deposition techniques are slow and impractical, however, when thick layers (greater than 500 nm) are desired. Alternatively, polyimide layers may be formed by cross-linking solution-deposited polyimide precursor. The total thickness that can practically attained in a single layer is limited, however, to about 25 microns. If a thicker layer is desired, it is necessary to apply a second layer of polyimide precursor on top of the first polyimide layer. In addition, in some applications, it is necessary to form a second polyimide layer, or a layer of a different polymer, on a previously applied polyimide layer to provide protection or insulation.

Poor adhesion results at the interface between the first polyimide layer and the second layer of polymer. To improve the adhesion between the layers, it is necessary to treat the surface of the first layer before the second layer is deposited. Treatment typically requires wet chemical processing. One such method, for example, involves the hydrolysis of cured polyimide film with an alkaline solution in a solvent or a mixture of solvents to produce a polyamic acid salt, which is transformed to a polyamic acid-containing surface onto which a liquid polyimide precursor is deposited and subsequently cured. See, for example, L. J. Matienzo and W. N. Unertl, "Adhesion of Metal Films To Polyimide," in *Polyimides: Fundamentals and Applications*, Chapter 21, p. 659 (M. K. Gosh & K. L. Mittal, eds., Marcel-Dekker, New York, 1996); and N. C. Stoffel, "Inter-diffusion and Adhesion of Polyimides," Ph.D. Thesis, Cornell University (1995).

Thus, a need exists for a method for improving the adhesion between a polyimide layer and a second layer of polymer, especially a second polyimide layer, that does not require wet chemical processing.

SUMMARY OF THE INVENTION

To meet this and other needs, and in view of its purposes, the present invention provides a method for improving the adhesion between a first polyimide layer and a second layer, especially a second polyimide layer, that does not require wet chemical processing. The method comprises:

(a) forming a doped layer over a substrate, the doped layer comprising (1) an organo-silicon compound and (2) either a first polymeric material or a first precursor composition that can be converted to a polymeric material after the doped layer has been applied, the doped layer having an outer surface and an inner surface, the inner surface facing the substrate;

(b) heating the doped layer and forming an organo-silicon-rich layer on the outer surface of the doped layer;

(c) converting the organo-silicon-rich layer to a silicon oxide-containing layer; and (d) forming an added layer over the organo-silicon-rich layer, the added layer comprising either a second polymeric material or a second precursor composition that can be converted to a polymeric material after the added layer has been applied to the silicon oxide-containing layer.

In one embodiment, the doped layer comprises a polyimide precursor composition. In another embodiment, the added layer comprises a polyimide precursor composition that, preferably, is converted to a polyimide layer. In still another embodiment, a layer of adhesion promoter is applied to the substrate before step (a). In a further embodiment, the invention is a composite structure comprising a substrate, a polymeric layer, a silicon oxide-containing layer, and an added layer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
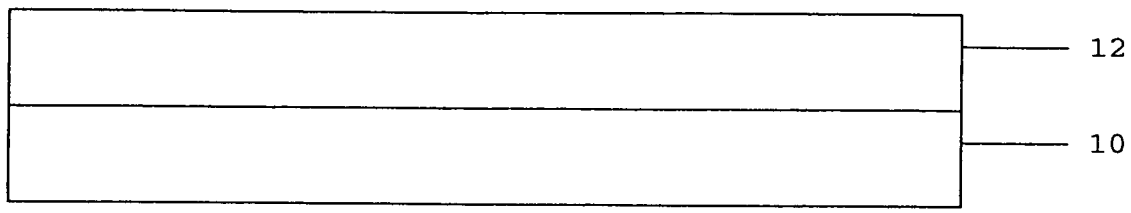
FIGS. 1a, 1b, 2a, 2b, 3a, 3b, 4a, 4b, 4c, 5a, 5b, and 5c are schematic cross-sectional views illustrating the steps in the sequential fabrication of a composite structure using the method of the present invention.

The invention will now be described by reference to the accompanying figures. Throughout the specification, similar reference characters refer to similar elements in all figures of the drawing. In the drawing, various aspects have been shown and schematically represented in a simplified manner to more clearly describe and illustrate the invention. The invention is not limited, however, to constructions of any particular shape. Although the invention is described with respect to use of a polyimide precursor composition, the invention is not so limited. Other polymeric materials or precursor compositions may also be used.

Referring to FIG. 1a, a composition comprising a mixture of (1) an organo-silicon compound and (2) either a polymeric material or a precursor composition that can be converted to a polymeric material after the layer has been applied, is applied to a substrate 10. A doped layer 12 is formed over substrate 10. Doped layer 12 comprises the polymeric material or precursor composition that can be converted to a polymeric material and the organo-silicon compound.

Substrate 10 may be, for example, a silicon substrate, a chip carrier, or an organic polymer substrate. As will be recognized by those skilled in the art, although the boundaries of substrate 10 are not shown, substrate 10 typically comprises a number of devices and may comprise multilayer devices.

The composition may be applied to substrate 10 by any conventional technique, such as spin coating. If necessary, the resulting layer is heated, typically about 100° C. to about 120° C., to remove the solvent.

The polymeric material may be, for example, a polyimide; a polyolefin, such as polyethylene, polypropylene, or polybutylene; a polyepoxide; a polyurethane; or a polycarbonate. Typically, the polymeric material is either a photosensitive or non-photosensitive polyimide precursor composition, which is converted to a layer of polyimide.

A non-photosensitive polyimide precursor composition typically comprises a dianhydride of a tetracarboxylic acid and a diamine, preferably a dianhydride of an aromatic tetracarboxylic acid and an aromatic diamine, which are converted to the polyimide on heating. Typical aromatic tetracarboxylic acid anhydrides used in polyimide precursor compositions include, for example: 3,3',4,4'-bi-phenyl-tetra-carboxylic acid di-anhydride (BPDA); 3,3',4,4'-benzo-phenone-tetra-carboxylic acid di-anhydride (BTDA); pyromellitic di-anhydride (PMDA); 4,4'-oxy-di-phthalic anhydride (ODPA); and 3,3',4,4'-di-phenyl-sulfone-tetra-carboxylic acid di-anhydride (DSDA). Typical aromatic diamines used in polyimide precursor compositions include, for example, 4,4'-oxy-bis-benzen-amine (ODA); m-phenyl-ene-di-amine (m-PDA), p-phenyl-ene-di-amine (p-PDA); di-amino-di-phenyl sulfone (DDS); di-amino-benzo-phenone; N,N'-di-phenyl-methyl-ene-di-amine, and 4,4'-(hexa-fluoro-iso-propyl-idene)-di-aniline.

If the polyimide precursor composition is a photosensitive composition, it is applied to a substrate and heated to remove the solvent. The resulting layer is imaged by exposure with actinic radiation, typically ultraviolet radiation in the range of about 250 nm to 400 nm. Imagewise exposure can be conducted through a photomask, or a computer-controlled laser can be used for exposure. The unexposed and unpolymerized regions of the layer are then removed with a developer to form an imaged layer of polyimide precursor, which is converted to a polyimide layer by heating as described below.

Photosensitive polyimide precursor compositions comprise a radiation-sensitive polyimide precursor and, typically, a photo-initiator system. These compositions and their use in the formation of polyimide layers are disclosed in U.S. Pat. No. 4,414,312, No. 4,416,973, and No. 4,454,220, each issued to Goff, and in U.S. Pat. No. 4,803,147, issued to Mueller. The disclosures of these patents are incorporated by reference.

Various organo-silicon compounds may be added to the polymeric material. Typically organo-silicon compounds include poly(methylalkyl) silicones, such as polydimethyl siloxane, and aromatic, especially phenyl, containing siloxanes, such as polydiphenyl siloxane. Poly-dimethyl siloxane is the preferred organo-silicon compound. About 0.5% to about 5% by weight, typically about 0.5 to 1.5% by weight, more typically about 1% by weight of the organo-silicon compound may be added to the polymeric material.

The polymeric material and organo-silicon compound are typically applied in a solvent. If the polymeric material is a polyimide precursor composition, the solvent is a polar aprotic solvent, such as N-methylpyrrolidone (NMP), N,N-dimethyl acetamide, or N,N-dimethyl formamide. Other materials that are conventional components of polyimide precursor compositions may also be present.

Figure 1B:
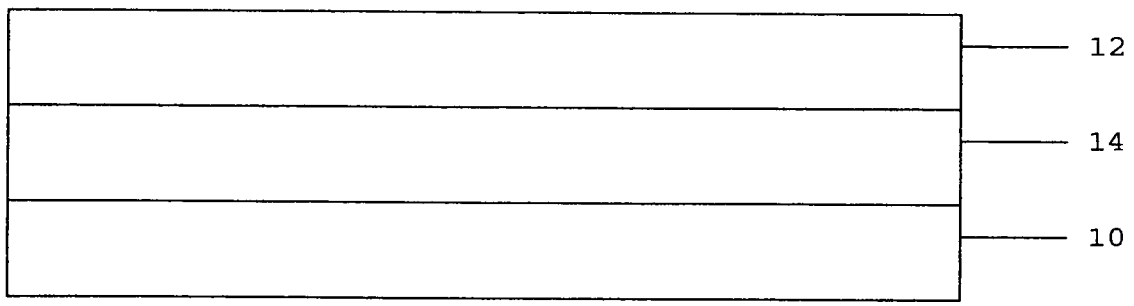

Referring to FIG. 1b, typically a layer 14 of coupling agent or adhesion promoter is applied to substrate 10 before doped layer 12 of polymeric material is applied. Layer 14 can be applied using conventional techniques, such as spin coating. Commercially available silane compounds useful as adhesion promoters include, for example, 3-amino-propyl-tri-ethoxy-silane, 3-glycidoxy-propyl-tri-methox-ysilane, N-(2-amino-ethyl)-3-amino-propyl-tri-ethoxy-silane, 3-amino-propyl-tri-methoxy-silane, N-(2-amino-ethyl)-3-amino-propyl-tri-methoxy-silane, 3-isocyanato-propyl-tri-ethoxy-silane, 10-amino-decyl-tri-methoxy-silane, 11-amino-undecyl-tri-methoxy-silane, n-propyl-tri-methoxy-silane, and phenyl-tri-methoxy-silane.

Figure 2A:
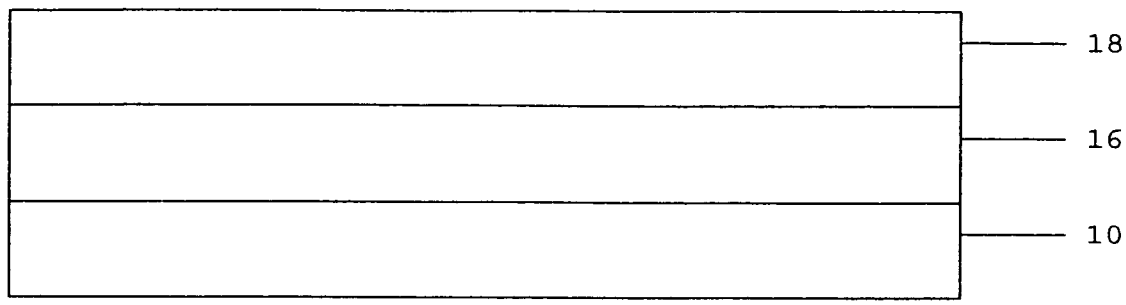
Figure 2B:
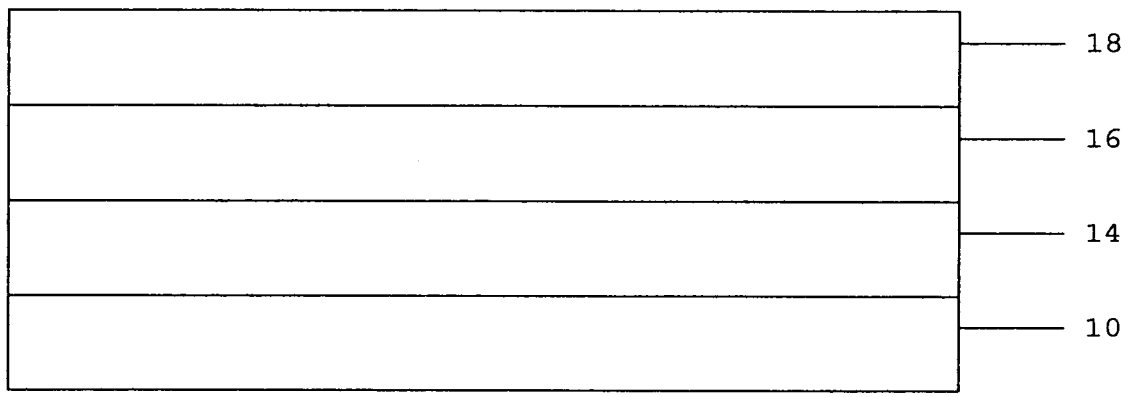

Referring to FIGS. 1a and 1b, doped layer 12 is heated. When the polymeric material is a polyimide precursor composition, doped layer 12 is heated, or cured, to convert the precursor composition to polyimide. A polymeric layer 16 is formed—as shown in FIG. 2a (which corresponds to FIG. 1a) and in FIG. 2b (which corresponds to FIG. 1b and includes layer 14 of coupling agent or adhesion promoter applied to substrate 10). If the composition contains a polyimide precursor composition, polymeric layer 16 is a first polyimide layer. If the precursor layer is an imaged and developed layer of photosensitive precursor composition, it is heated in the same manner to form a layer of imaged polyimide. A polyimide precursor composition is typically heated at about 150° C. to about 450° C. for about 20 minutes to 4 hours, typically in an inert atmosphere such as in a nitrogen atmosphere.

Although not being bound by any theory or explanation, it is believed that during the heating step some or all of the organo-silicon compound migrates from the bulk of the doped layer to the surface of the layer. Organo-silicon-rich layer 18 is formed on the surface of polymeric layer 16. Organo-silicon compounds typically have lower surface energies than other polymers, such as polyimides. The surface energy of poly-di-methyl siloxane (about 24 dynes/cm), for example, is lower than that of polyimide (about 40 dynes/cm). Although organo-silicon-rich layer 18 has been depicted as a separate layer in FIGS. 2a and 2b, it may be an organo-silicon-rich region rather than a discrete, separate layer.

Figure 3A:
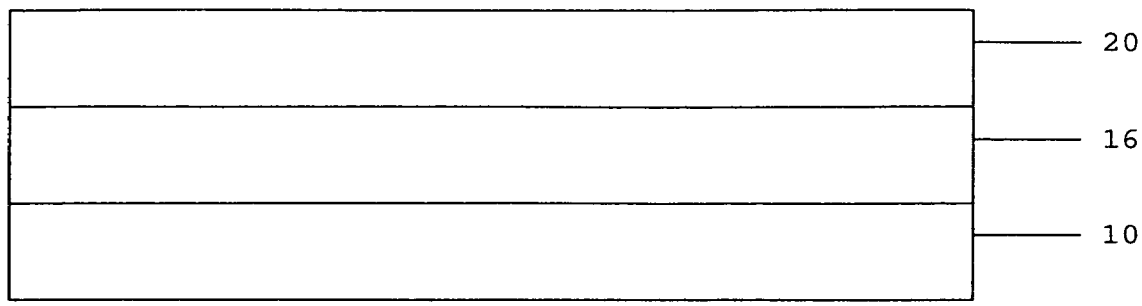
Figure 3B:
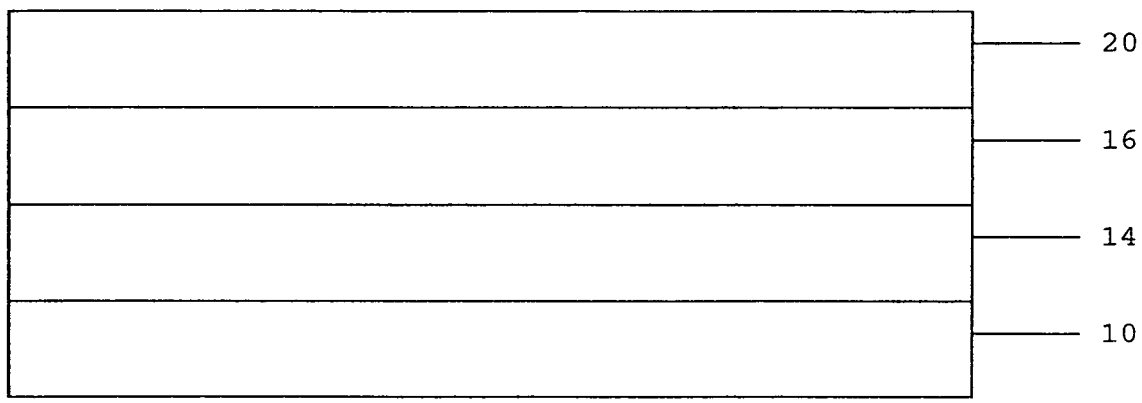

Referring to FIGS. 3a and 3b, organo-silicon-rich layer 18 is converted to a silicon oxide-containing layer 20. Although all organo-silicon-rich layer 18 has been depicted as being converted to silicon oxide-containing layer 20, part of the organo-silicon compound in organo-silicon-rich layer 18, or organo-silicon-rich region, especially organo-silicon compound not on the surface, may not be converted to silicon oxide.

Organo-silicon-rich layer 18 is converted to silicon oxide-containing layer 20 by a surface-oxidizing step. Surface oxidizing steps include, for example, corona discharge, plasma, flame plasma, and ultraviolet-ozone treatment. Although wet chemical oxidation can be used, use of any of the other methods avoids the need to conduct a wet chemical processing step. These methods are discussed, for example, in U.S. Pat. No. 5,913,999 issued to Hayashida, especially at column 8, lines 4-39, and this disclosure is incorporated by reference.

Ultraviolet-ozone treatment may be conducted using a low-pressure mercury vapor lamp with a quartz envelope, which emits strongly at two wavelengths, 184.9 nm and 253.7 nm. Oxygen molecules absorb strongly at 184.9 nm and dissociate to form atomic oxygen that reacts with oxygen molecules to form ozone ($O_3$). Ozone strongly absorbs at 253.7 nm. Both atomic oxygen and ozone can oxidize organic and organo-metallic materials. Ultraviolet radiation can form one or more free radicals, excited molecules, and ions in the polymeric material. Ultimately, the organic radicals react with atomic oxygen, ozone, or both to convert at least some of the organo-silicon compound in organo-silicon-rich layer 18 to silicon oxide and form silicon oxide-containing layer 20.

An ultraviolet-ozone treatment is conveniently conducted in a commercial ultraviolet-ozone cleaning system. Although the treatment time is not critical, treatment is typically carried out for about 10 minutes to about 60 minutes.

Figure 4A:
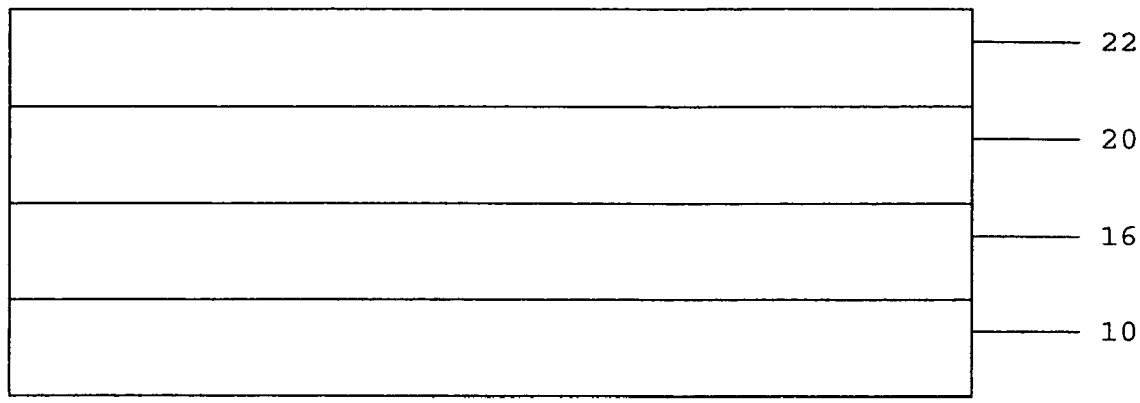
Figure 4B:
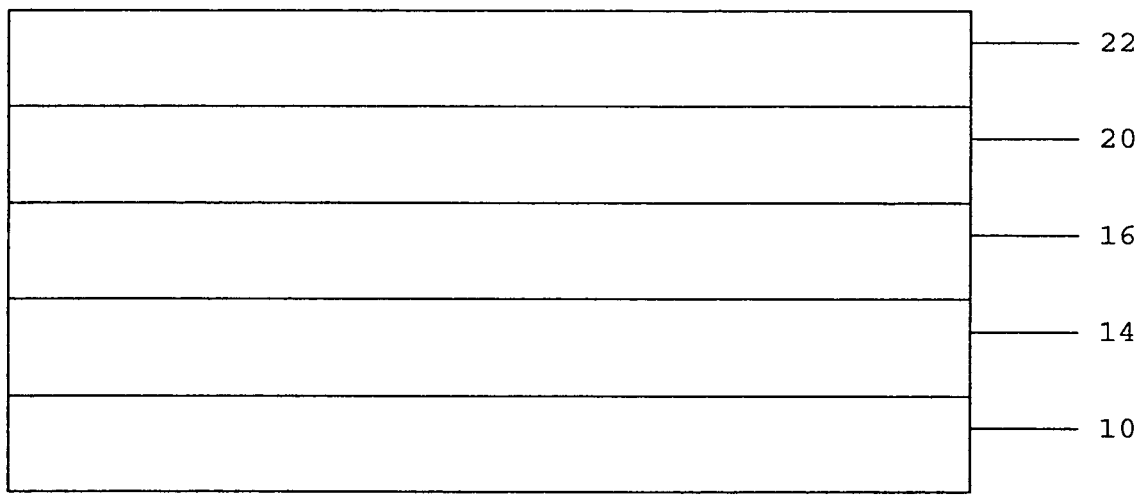

Referring to FIGS. 4a and 4b, an added layer 22 is applied to silicon oxide-containing layer 20. Added layer 22 comprises a polymeric material or a precursor composition that forms a polymeric material after the layer has been applied. The composition may be applied to the substrate by any conventional technique, such as spin coating. The polymeric material may be, for example, a polyimide; a polyolefin, such as polyethylene, polypropylene, or polybutylene; a polyepoxide; a polyurethane; or a polycarbonate.

Figure 4C:
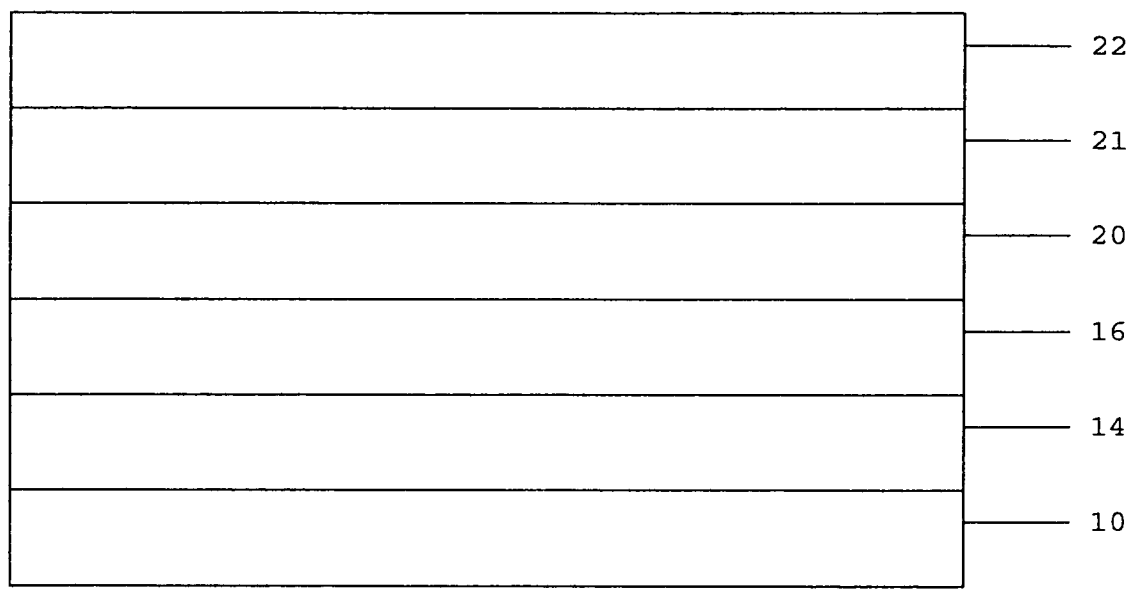

In some instances, a layer 21 comprising a coupling agent or adhesion promoter is applied (see FIG. 4c) to silicon oxide-containing layer 20 before added layer 22 is applied. Layer 21 may be applied using conventional techniques, such as, for example, spin coating. Commercially available silane compounds useful as adhesion promoters include those that can be used to form layer 14 as described above.

Figure 5A:
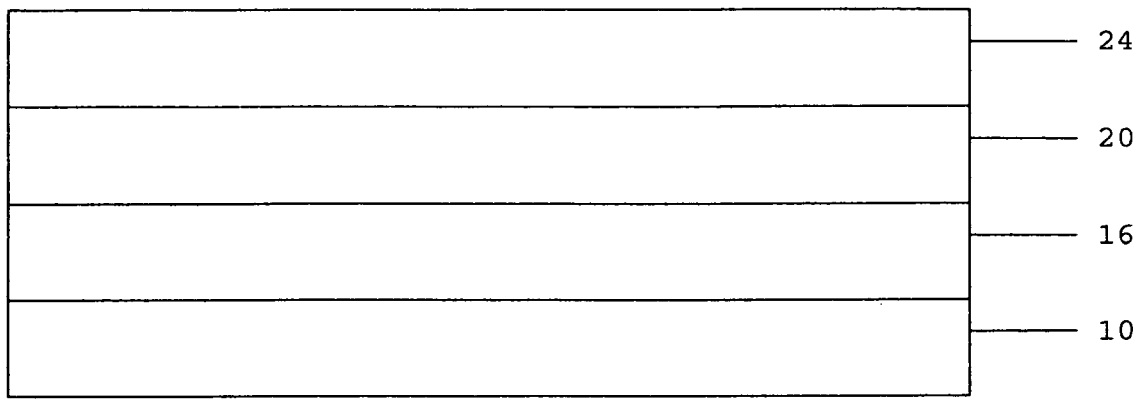
Figure 5B:
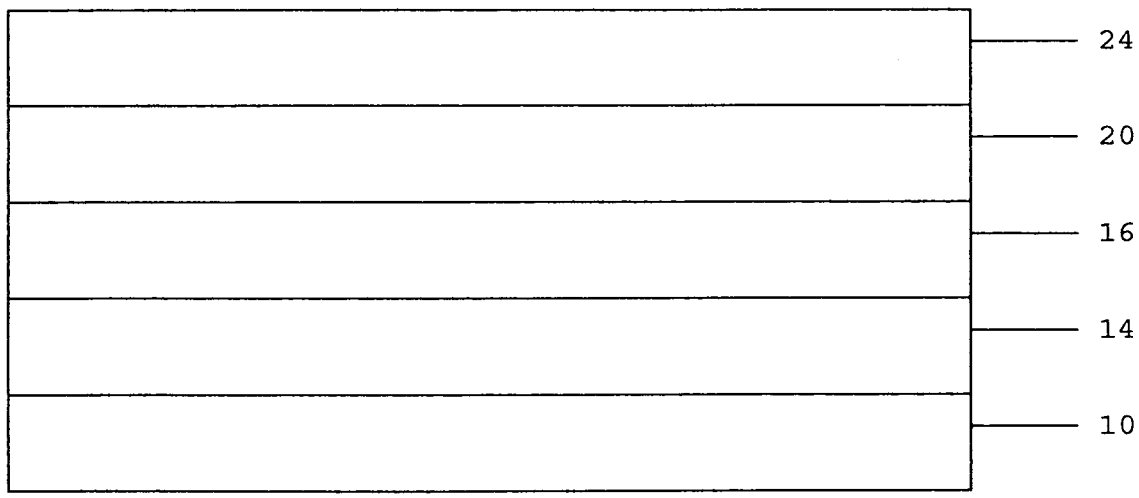
Figure 5C:
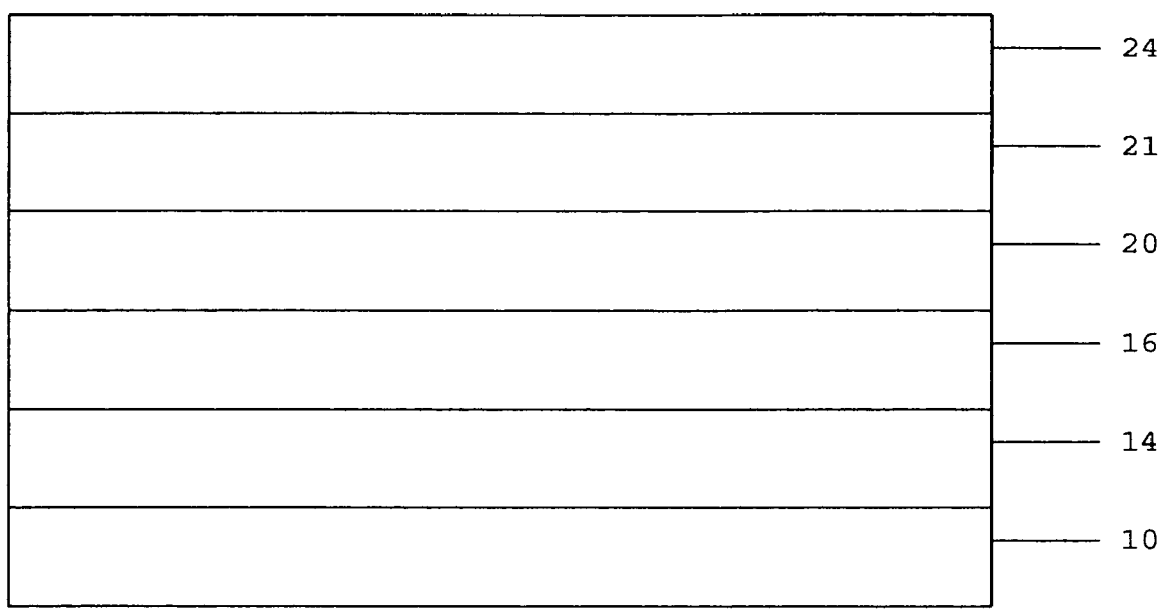

Typically the polymeric material of added layer 22 is either a photosensitive or non-photosensitive polyimide precursor composition such as described above. If added layer 22 comprises a polyimide precursor composition, it is heated to remove solvent, as described above, and then heated to convert the polyimide precursor to a second polyimide-containing layer 24. As shown in FIGS. 5a, 5b, and 5c, a composite structure is formed comprising substrate 10, optionally a first layer of adhesion material 14 (FIGS. 5b and 5c), polymeric layer 16, silicon oxide-containing layer 20, optionally a second layer of adhesion material 21 (FIG. 5c), and second polyimide-containing layer 24.

If a thicker polyimide layer is desired, a polyimide precursor composition doped with an organo-silicon compound may be used and the procedure described above repeated to produce a composite structure comprising a substrate, preferably a layer of adhesion material, a first polyimide layer, a first silicon oxide-containing layer, a second polyimide layer, a second silicon oxide-containing layer (not shown), and a third polyimide layer (also not shown).

In another aspect of the present invention, substrate 10 is an integrated circuit (IC) device (or chip). The surface of the device comprises a passivation layer that protects the device from both mechanical damage and from damage induced by certain types of naturally occurring radiation (e.g., alpha particles). This passivation layer is typically polyimide.

In the initial stages of electronic package assembly, integrated circuit devices must be both electrically and mechanically attached to chip carriers, which comprise either ceramic substrates or organic laminates. Conductive terminals on the device, usually metal pads located in openings in the passivation layer, are physically and electrically connected to the wiring pattern on the chip carrier.

In wirebonding, the connections between the terminals on the chip and the terminals on the chip carrier are made using thin conductive wires. To protect the connections, to keep the wires from touching each other, and to environmentally protect the surface of the device, the device and wires are encapsulated in an organic-based material known as an encapsulant.

In "flip chip assembly," metallic bumps (e.g., solder) are placed on the conductive terminals on the circuit side of the device. In the joining process, the device is placed circuit-side down (hence, the name "flip chip") so that the metallic bumps on the device mate with corresponding metal terminals on the chip carrier. The assembly is then heated so that the metal melts to form a connection.

There is a space between the chip and the chip carrier, the thickness of which corresponds to the thickness of the metallic joint. The coefficients of thermal expansion of the device and chip carrier are usually mismatched. To overcome the strain produced by this mismatch on thermal excursions, an underfill encapsulant, also called an underfill, is included between the device and the chip carrier. The encapsulant is applied near the edges of the chip as a liquid mixture. The liquid fills the space between the chip and the chip carrier. The encapsulant is then fully cured in an oven. The encapsulant mechanically couples the chip and the chip carrier, and decreases the strain on the solder joints to improve device lifetime.

Encapsulants are typically a liquid mixture of an epoxy compound and hardener. When the liquid mixture is heated, the hardener catalyzes formation of a polyepoxide (i.e., an epoxy resin) from the epoxy compound. The liquid also typically comprises solid inorganic particles to control the coefficient of thermal expansion of the cured encapsulant. For example, the encapsulant may comprise a liquid epoxy compound, a hardener such as an amine, and suspended particles of a thermally conductive and electrically insulating material, such as silica.

In both wirebonding and flip chip assembly, it is important to maintain a good bond between the encapsulant and the passivation layer on the device. If the encapsulant delaminates from the passivation layer, the mismatches in thermal expansion among the components of the assembled package can cause damage of the electrical connections during thermal cycling.

Figure 6A:
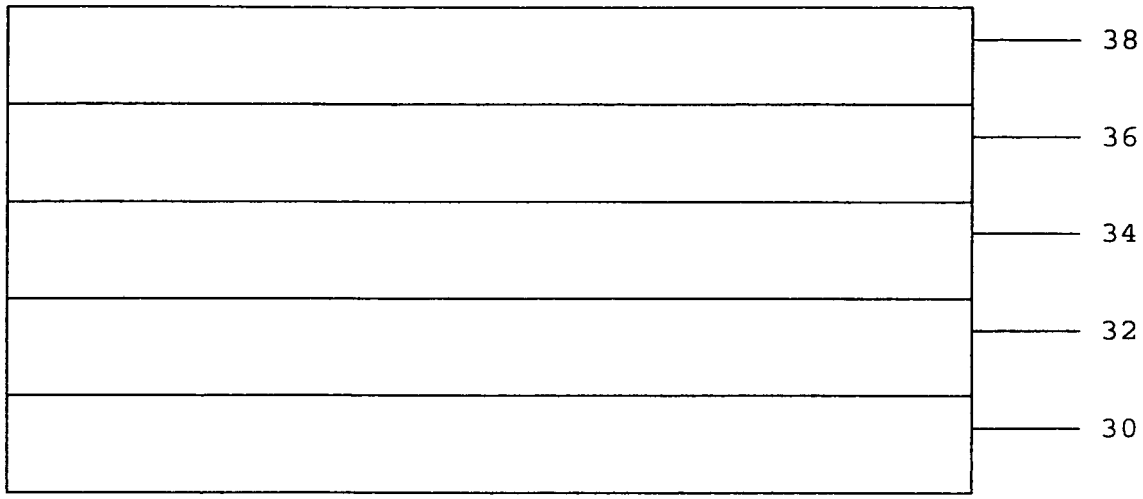
FIGS. 6a and 6b are schematic cross-sectional views of a chip attached to a chip carrier by the method of the present invention.

Referring to FIG. 6a, in the flip chip embodiment, the integrated circuit device 30 is protected by a polyimide passivation layer 32. To improve the adhesion between the encapsulant 36 and passivation layer 32, passivation layer 32 is doped with a low surface energy organo-silicon compound that segregates to the surface of passivation layer 32 during curing of the polyimide. The organo-silicon compound is converted to silicon oxide by exposure to an ultraviolet-ozone environment. A silicon oxide-containing layer 34 is formed on the surface of passivation layer 32. Encapsulant 36 fills the space between silicon oxide-containing layer 34 and the chip carrier 38. Silicon oxide-containing layer 34 improves the adhesion between organic-based encapsulant 36 and polyimide passivation layer 32.

Figure 6B:
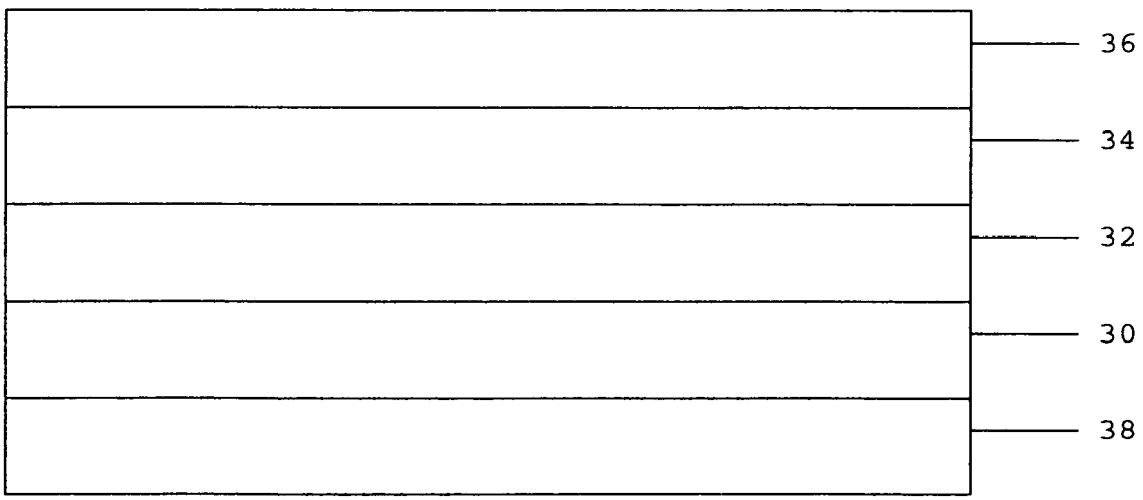

Referring to FIG. 6b, in the wirebonding embodiment, integrated circuit device 30 on chip carrier 38 is protected by polyimide passivation layer 32. Integrated circuit device 30 may be adhered to chip carrier 38 by a layer of adhesive (not shown). Passivation layer 32 is doped with a low surface energy organo-silicon compound that segregates to the surface of passivation layer 32 during curing of the polyimide. The organo-silicon compound is converted to silicon oxide by exposure to an ultraviolet-ozone environment. Silicon oxide-containing layer 34 is formed on the surface of passivation layer 32. Encapsulant 36 is located over silicon oxide-containing layer 34.

In either the flip chip or wirebonding embodiment, a layer of coupling agent or adhesion promoter (not shown) may be applied between silicon oxide-containing layer 34 and encapsulant 36. Coupling agents are discussed above.

INDUSTRIAL APPLICABILITY

The invention can be used in the manufacture of semiconductor devices, which are used in, for example, digital computers. In can also be used in the attachment of semiconductor devices to chip carriers in using either wirebonding or flip chip assembly.

Although the invention has been illustrated with a single composite structure, it is not so limited. As will be apparent to those skilled in the art, the methods of the invention can be used in the fabrication of complex single and multilevel devices. It may be used in any situation in which it is desired to form a thick layer of polyimide. More specifically, the method as described above addresses the use of one added polymer layer. In fact, the method can be used to add a second, a third, a fourth, and other polymer layers as long as all but the last layer are doped.

The advantageous properties of the invention can be observed by reference to the following examples, which illustrate but do not limit the invention.

EXAMPLES

Example 1

This first example illustrates the preparation of an element comprising substrate 10, layer 14 comprising an adhesion agent, polyimide layer 16, and layer 20 comprising silicon oxide.

Preparation of organo-silicon dopant solution: Equal parts, by weight, of polydimethyl siloxane and hexane were mixed in a vial.

Preparation of the doped polyimide solution: The organo-silicon dopant solution (0.4 g) was mixed with 6.4 g N-methyl pyrrolidone. The resulting solution was mixed with 21 g PYRALIN® PI-5878 polyimide precursor (a PMDA/ODA containing polyimide precursor; Du Pont, Wilmington, Del.) such that the final solution contained 21 g PI-5878 polyimide precursor, 6.4 g N-methylpyrrolidone, 0.2 g polydimethyl siloxane, and 0.2 g hexane.

Preparation of the adhesion promoter solution: 10 parts SILQUEST® A-1100 adhesion promoter (3-amino-propyl-tri-ethoxy-silane) was mixed with 10 parts methanol and 1 part deionized water. The mixture was left standing in a stoppered bottle overnight. Just prior to use, 10 g of this solution was mixed with 200 ml methanol.

Preparation of test samples: To form adhesion promoter layer 14, the adhesion promoter solution was spin coated onto silicon wafers, 82 mm diameter, at 2,000 rpm for 30 seconds. The coated wafers were baked for 15 minutes in air at 110° C.

To form polyimide precursor-containing layer 12, the doped polyimide precursor composition containing solution was spin coated onto these wafers at 6,000 rpm for 30 seconds. The resulting coated wafers were baked in air for 20 minutes at 110° C. Then they were baked in flowing nitrogen gas by ramping from room temperature to 350° C. at a rate of 10° C./minute, holding at 350° C. for 60 minutes, and cooling to room temperature at a rate of 10° C./minute. This converted polyimide precursor-containing layer 12 to polyimide layer 16 and organo-silicon-rich layer 18. The final thickness of the combined layers was 1.5 µm.

To form silicon oxide-containing layer 20, the coated wafers were then treated in a Uvocs, Inc., Model T0606B ultraviolet-ozone cleaning system for 60 minutes. Treatment was conducted in air at atmospheric pressure. The system consisted of an ultraviolet source and a chamber to house the source and the sample. The ultraviolet source was a 6 inch by 6 inch (about 14.4 cm×14.4 cm) low-pressure mercury vapor grid lamp with a quartz envelope. Samples are positioned such that the surface is 5.7 mm from the lamp envelope.

High resolution XPS spectra in the Si 2p region were obtained for silicon oxide rich layer 20. A peak at 102.4 eV, attributed to O—Si—C bonds in the polydimethyl siloxane, was observed prior to treatment. Following treatment, a peak at 103.8 eV, corresponding to $SiO_x$, where x is between 1.6 and 2, was observed.

Comparative Example 1

Preparation of polyimide precursor solution: 21 g of PYRALIN® PI-5878 polyimide precursor was mixed with 6.4 g N-methylpyrrolidone and allowed to stand overnight in a stoppered bottle. The solution was mixed again just prior to application. Layers of the undoped polyimide were coated onto silicon wafers using the same parameters of spinning and baking as described above.

Example 2

Each of the two groups of wafers, i.e., those prepared in Example 1 and those prepared in Comparative Example 1, were coated again with the undoped polyimide solution. The thickness of the polyimide coating was adjusted by varying the spin speed.

The adhesion of the undoped polyimide layer to silicon oxide-containing layer 20, formed by ultraviolet-ozone treatment of the doped polyimide layer was compared to the adhesion of the layer obtained when undoped polyimide was applied to the undoped polyimide by two techniques. For thick layers, a strip was defined by scribing a feature in the layer. It was possible to peel the undoped polyimide overlayer from the underlying undoped polyimide substrate. Attempts to peel the undoped polyimide layer from a doped and treated substrate revealed greater adhesion, however, resulting in an inability to peel the strip from the substrate and tearing of the strip.

A second test performed on thinner polyimide overlayers involved scribing a series of lines to produce a cross-hatched region. When an adhesive tape was applied to this region and peeled from the surface, the polyimide overlayer was removed from the underlying undoped polyimide over 40% of the area tested. A similar test performed using a doped and treated polyimide substrate resulted in no removal of the polyimide overlayer.

Example 3

This third example shows that polydimethyl siloxane migrates to the surface of a polydimethyl siloxane doped polyimide layer. Polydimethyl siloxane doped PYRALIN® PI-5878 polyimide precursor containing 0.2 g of siloxane per 21 g of polyimide precursor was coated on a silicon wafer pretreated with an adhesion promoter and thermally cured by heating from about 150° C. to about 450° C. in about 20 minutes and then heating at 450° C. for 4 hours. The final thickness of the polyimide layer was about 1.5 microns. The advancing distilled water contact angle was measured and compared with the contact angles for polydimethyl siloxane and for undoped polyimide.

The advancing distilled water contact angles were measured by conventional techniques using a telescope with a calibrated eyepiece to view the cross-section of a drop of deionized water on the surface of the layer. The results are shown in Table 1.

TABLE 1

| Material | Contact Angle (°) |
| --- | --- |
| Undoped polyimide | 70 |
| Polydimethyl siloxane doped polyimide | 104 |
| Polydimethyl siloxane | 109 |

Example 4

Figure 7:
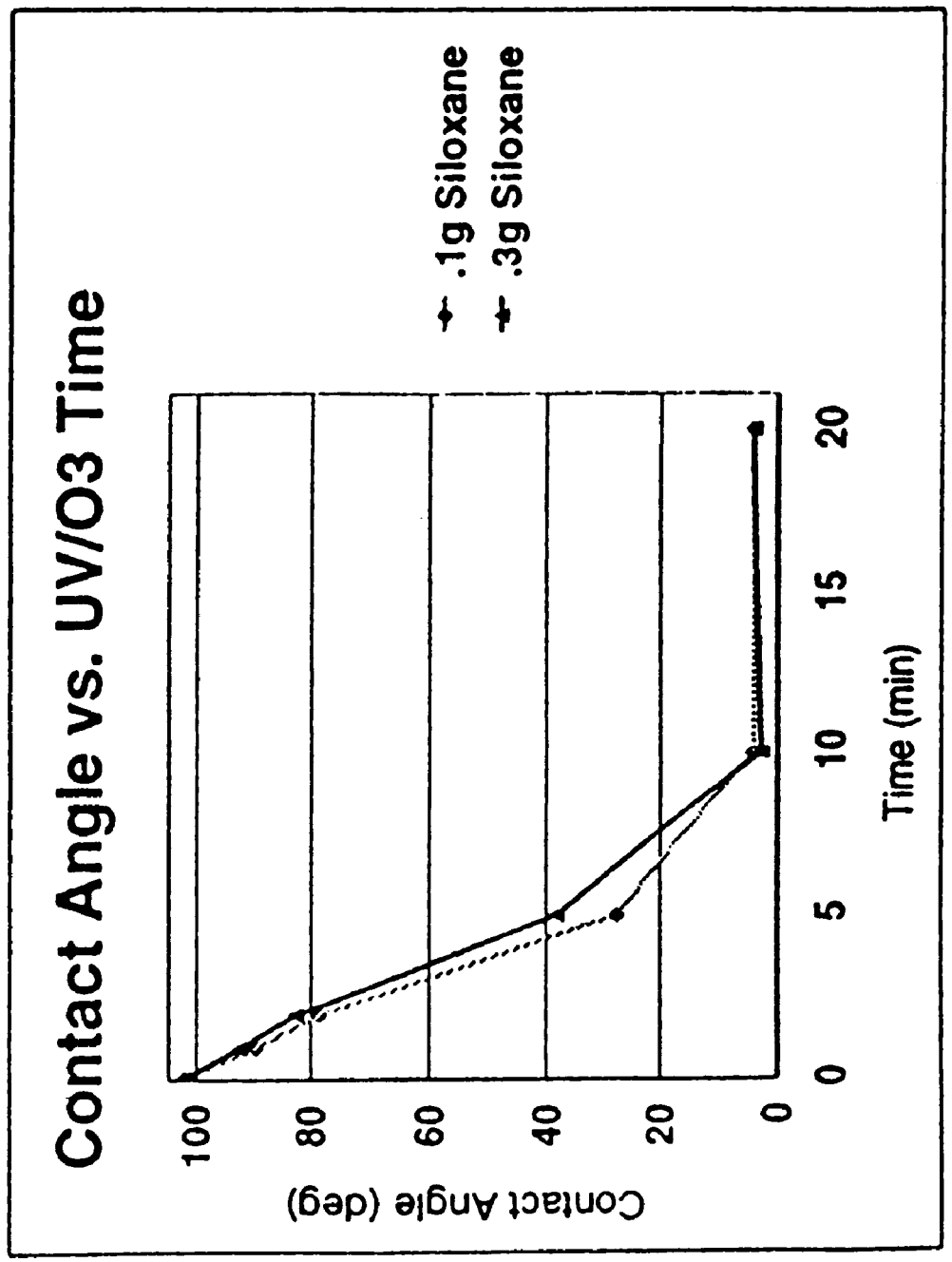
FIG. 7 shows the advancing contact angle for the organo-silicon compound-containing layer as a function of oxidation time and concentration of organo-silicon compound.

This fourth example shows the change in the deionized water contact angle for the silicon oxide-containing layer 20 as a function of the oxidation time and the initial concentration of polydimethyl siloxane. A more hydrophilic surface will yield a smaller contact angle. The initial polydimethyl siloxane concentrations in doped polyimide precursor layer 12 were 0.1 g/21 g and 0.3 g/21 g. The results are shown in FIG. 7.

Although the invention has been particularly shown and described with reference to the preferred embodiments, those skilled in the art will appreciate that various modifications and changes in form and details may be made without departing from the spirit and scope of the invention. For example, in the preceding description specific details are set forth to provide a more thorough understanding of the invention, but it will be apparent to those skilled in the art that the invention may be practiced without using these specific details.

Having described the invention, we now claim the following and their equivalents.

What is claimed is:

1. A structure formed by the steps of:
    (a) forming a doped layer over a substrate, the doped layer comprising (1) an organo-silicon compound and (2) either a first polymeric material or a first precursor composition that can be converted to the first polymeric material after the doped layer has been applied to the substrate, the doped layer having an outer surface and an inner surface, the inner surface facing the substrate;
    (b) heating the doped layer and forming an organo-silicon-rich layer on the outer surface of the doped layer;
    (c) converting the organo-silicon-rich layer to a silicon oxide-containing layer consisting essentially of silicon oxide; and
    (d) forming an added layer over the silicon oxide-containing layer, the added layer comprising either a second polymeric material or a second precursor composition that can be converted to the second polymeric material after the added layer has been applied to the silicon oxide-containing layer;
    in which the first polymeric material is a polyimide; and the second polymeric material is selected from the group consisting of polyimides, polyolefins, polyepoxides, polyurethanes, and polycarbonates.

2. The structure of claim 1 in which the added layer comprises a polyimide precursor composition and the method additionally comprises, after step (d), the step of heating the added layer to form a polyimide-containing layer.

3. The structure of claim 1 in which the substrate is an integrated circuit device and the doped layer comprises a polyimide precursor composition.

4. The structure of claim 3 in which the second precursor composition is a liquid that comprises an epoxy compound, a hardener, and particles of a thermally conductive and electrically insulating material, and the method additionally comprises, after step (d), the step of heating the added layer to form the polyepoxide.

5. The structure of claim 1 in which the method additionally comprises, after step (c) and before step (d), the step of applying a layer of adhesion promoter over the silicon oxide-containing layer.

6. The structure of claim 5 in which the adhesion promoter is selected from the group consisting of 3-amino-propyl-tri-ethoxy-silane, 3-glycidoxy-propyl-tri-methoxy-silane, N-(2-amino-ethyl)-3-amino-propyl-tri-ethoxy-silane, 3-amino-propyl-tri-methoxy-silane, N-(2-amino-ethyl)-3-amino-propyl-tri-methoxy-silane, 3-isocyanato-propyl-tri-ethoxy-silane, 10-amino-decyl-tri-methoxy-silane, 11-amino-undecyl-tri-methoxy-silane, n-propyl-tri-methoxy-silane, and phenyl-tri-methoxy-silane.

7. The structure of claim 1 in which the organo-silicon compound is a polysiloxane.

8. The structure of claim 2 in which the organo-silicon compound is a polysiloxane.

9. The structure of claim 5 in which the organo-silicon compound is a polysiloxane.

10. The structure of claim 3 in which the organo-silicon compound is a polysiloxane and the second polymeric material is a polyepoxide.

11. The structure of claim 1 in which the doped layer comprises about 0.5 to 1.5% by weight of the organo-silicon compound, and the organo-silicon compound is poly-dimethyl siloxane.

12. The structure of claim 11 in which the substrate is an integrated circuit device and the doped layer comprises a polyimide precursor composition.

13. The structure of claim 12 in which the second precursor composition is a liquid that comprises an epoxy compound, a hardener, and particles of a thermally conductive and electrically insulating material, and the method additionally comprises, after step (d), the step of heating the added layer to form the polyepoxide.

14. The structure of claim 13 in which the method additionally comprises, after step (c) and before step (d), the step of applying a layer of adhesion promoter over the silicon oxide-containing layer.

* * * * *